(12) United States Patent
Kobayashi et al.

(10) Patent No.: US 11,470,275 B2
(45) Date of Patent: Oct. 11, 2022

(54) PHOTOELECTRIC CONVERSION DEVICE, PHOTOELECTRIC CONVERSION SYSTEM AND MOVING BODY

(71) Applicant: CANON KABUSHIKI KAISHA, Tokyo (JP)

(72) Inventors: Hideo Kobayashi, Tokyo (JP); So Hasegawa, Kanagawa (JP); Yu Katase, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/333,305

(22) Filed: May 28, 2021

(65) Prior Publication Data

US 2021/0391365 A1    Dec. 16, 2021

(30) Foreign Application Priority Data

Jun. 15, 2020   (JP) .............................. JP2020-102865

(51) Int. Cl.
*H04N 5/378*    (2011.01)
*H04N 5/369*    (2011.01)
(Continued)

(52) U.S. Cl.
CPC ....... *H04N 5/378* (2013.01); *H01L 27/14614* (2013.01); *H01L 27/14636* (2013.01); *H04N 5/3698* (2013.01); *H04N 5/3745* (2013.01)

(58) Field of Classification Search
CPC .... H04N 5/3698; H04N 5/3745; H04N 5/378; H04N 5/379; H01L 27/14614; H01L 27/14636
See application file for complete search history.

(56) References Cited

U.S. PATENT DOCUMENTS 7,990,440 B2    8/2011   Kobayashi
8,710,558 B2    4/2014   Inoue
(Continued)

FOREIGN PATENT DOCUMENTS

EP      3358829 A1    8/2018
JP     2013-93872 A    5/2013
(Continued)

OTHER PUBLICATIONS

U.S. Appl. No. 17/241,297, filed Apr. 27, 2021 by Kazuhiro Saito et al.

(Continued)

*Primary Examiner* — Lin Ye
*Assistant Examiner* — Chriss S Yoder, III
(74) *Attorney, Agent, or Firm* — Venable LLP

(57) ABSTRACT

Provided is a photoelectric conversion device including a pixel array in which pixels, each of the pixels including a photoelectric conversion element, are arranged in columns, a signal line that is arranged corresponding to one of the columns in the pixel array and to which a signal from the pixel is output, a current source configured to supply the signal line with a driving current; a current adjusting unit configured to control the driving current into a current amount including a first current amount and a second current amount greater than the first current amount, and an assisting element configured to assist a change in a current flowing through the signal line when the driving current changes from the first current amount to the second current amount. The first current amount is a current amount in a state where the driving current is disconnected.

26 Claims, 15 Drawing Sheets

(51) Int. Cl.
*H01L 27/146* (2006.01)
*H04N 5/3745* (2011.01)

(56) References Cited

U.S. PATENT DOCUMENTS

| | | | |
|---|---|---|---|
| 8,835,828 | B2 | 9/2014 | Kobayashi |
| 8,884,391 | B2 | 11/2014 | Fudaba |
| 9,264,641 | B2 | 2/2016 | Kobayashi |
| 9,305,954 | B2 | 4/2016 | Kato |
| 9,357,122 | B2 | 5/2016 | Kususaki |
| 9,407,847 | B2 | 8/2016 | Maehashi |
| 9,438,828 | B2 | 9/2016 | Itano |
| 9,509,931 | B2 | 11/2016 | Kobayashi |
| 9,602,752 | B2 | 3/2017 | Kobayashi |
| 10,015,430 | B2 | 7/2018 | Kobayashi |
| 10,609,316 | B2 | 3/2020 | Kobayashi |
| 2009/0295968 | A1* | 12/2009 | Matsuda ............ H04N 5/378 348/308 |
| 2012/0175503 | A1 | 7/2012 | Kuroda |
| 2013/0140440 | A1 | 6/2013 | Kobayashi |
| 2013/0147997 | A1* | 6/2013 | Naganokawa ...... H04N 5/335 348/302 |
| 2015/0062367 | A1* | 3/2015 | Inui ............ H01L 27/14603 348/222.1 |
| 2016/0150176 | A1* | 5/2016 | Hiyama ............ H04N 5/3745 348/301 |
| 2016/0170046 | A1 | 6/2016 | Kimura |
| 2016/0227141 | A1 | 8/2016 | Kobayashi |
| 2020/0036921 | A1 | 1/2020 | Funamizu |
| 2020/0378828 | A1 | 12/2020 | Kobayashi |
| 2020/0396402 | A1* | 12/2020 | Freson ............ H04N 5/3698 |
| 2021/0021770 | A1 | 1/2021 | Nakazawa |
| 2021/0021777 | A1 | 1/2021 | Kobayashi |
| 2021/0021782 | A1 | 1/2021 | Sato |

FOREIGN PATENT DOCUMENTS

| | | |
|---|---|---|
| JP | 2013-123107 A | 6/2013 |
| JP | 2019-195213 A | 11/2019 |

OTHER PUBLICATIONS

U.S. Appl. No. 17/272,040, filed Feb. 26, 2021 by Takehiko Soda et al.

U.S. Appl. No. 17/383,847, filed Jul. 23, 2021 by Hideo Kobayashi.

* cited by examiner

PHOTOELECTRIC CONVERSION DEVICE, PHOTOELECTRIC CONVERSION SYSTEM AND MOVING BODY

BACKGROUND OF THE INVENTION

Field of the Invention

The present disclosure relates to a photoelectric conversion device, a photoelectric conversion system and a moving body.

Description of the Related Art

Japanese Patent Application Laid-Open No. 2013-123107 discloses an imaging device including a driving unit for electrically disconnecting between a pixel and a signal line and between a signal line and a current source.

When the signal line and the current source are electrically disconnected and then reconnected, a fluctuation in power source potential may occur. The signal quality may deteriorate due to the fluctuation of the power supply potential.

Accordingly, the present disclosure intends to provide a photoelectric conversion device in which signal quality deterioration caused by power source potential fluctuation is reduced.

SUMMARY OF THE INVENTION

According to an aspect of the present disclosure, there is provided a photoelectric conversion device including a pixel array in which a plurality of pixels, each of the plurality of pixels including a photoelectric conversion element, are arranged in a plurality of columns, a signal line that is arranged corresponding to one of the plurality of columns in the pixel array and to which a signal from the pixel is output, a current source configured to supply the signal line with a driving current, a current adjusting unit configured to control the driving current into a current amount including a first current amount and a second current amount greater than the first current amount, and an assisting element configured to assist a change in a current flowing through the signal line when the driving current changes from the first current amount to the second current amount. The first current amount is a current amount in a state where the driving current is disconnected.

According to another aspect of the present disclosure, there is provided a photoelectric conversion device including a pixel array in which a plurality of pixels, each of the plurality of pixels including a photoelectric conversion element, are arranged in a plurality of columns, a signal line that is arranged corresponding to one of the plurality of columns in the pixel array and to which a signal from the pixel is output, a current source configured to supply the signal line with a driving current, a current adjusting unit configured to control the driving current into a current amount including a first current amount and a second current amount greater than the first current amount, and an assisting element configured to assist a change in a current flowing through the signal line when the driving current changes from the first current amount to the second current amount. The current adjusting unit is a switch configured to control connection or disconnection between the current source and the signal line.

Further features of the present invention will become apparent from the following description of exemplary embodiments with reference to the attached drawings.

DESCRIPTION OF THE EMBODIMENTS

Embodiments in the present disclosure will be described in detail below by using the drawings. Same components or corresponding components across the drawings are labeled with same references, and the description thereof may be omitted or simplified.

First Embodiment

In the present embodiment, an example of an imaging device which is a type of photoelectric conversion device to which the present disclosure may be applied will be described, but the present disclosure is not limited thereto. Examples of the photoelectric conversion device to which the present disclosure may be applied include an imaging device, a focus detection device, a ranging device, a time of flight (TOF) camera, or the like.

Figure 1A:
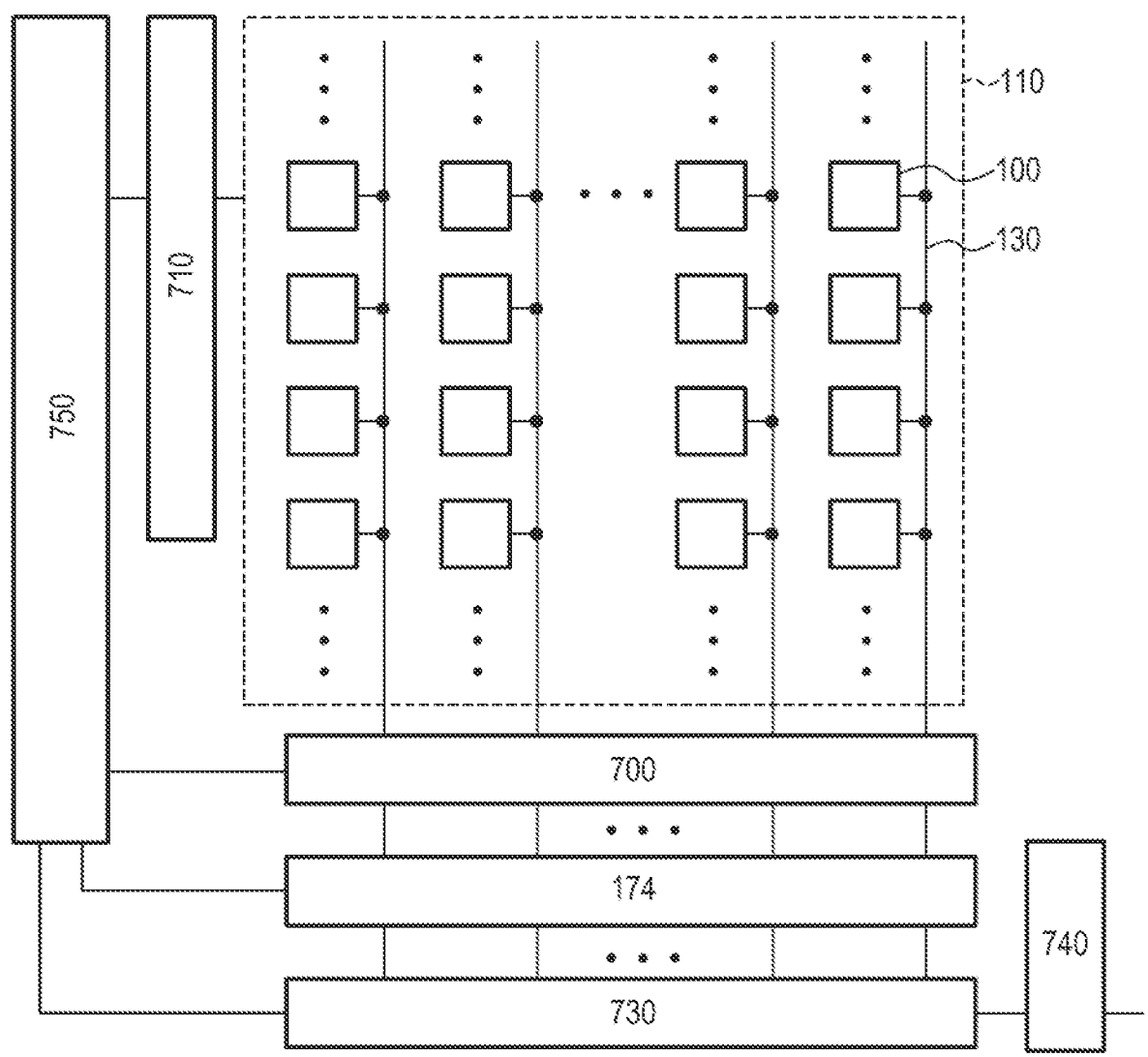
FIG. 1A is a schematic diagram illustrating a general configuration example of a photoelectric conversion device according to a first embodiment.

FIG. 1A is a schematic diagram illustrating a general configuration example of a photoelectric conversion device according to the present embodiment. The photoelectric conversion device includes a pixel array 110 including pixels 100 arranged in a plurality of rows and a plurality of columns, and a signal line 130 to which pixels 100 of the corresponding column are connected. Further, the photoelectric conversion device includes a current source unit 700 for supplying a current to the signal line 130. Further, the photoelectric conversion device includes a vertical scanning circuit 710 for scanning the pixels 100 in a row basis. Further, the photoelectric conversion device includes, from the pixel 100 to the signal line 130, a column circuit unit 174 for processing a signal read out by scanning of the vertical scanning circuit 710, and a horizontal scanning circuit 730 for horizontally scanning the column circuit unit 174. The signal read out from the column circuit unit 174 by the horizontal scanning of the horizontal scanning circuit 730 is output by an output unit 740 to the outside of the photoelectric conversion device. The photoelectric conversion device includes a timing generator 750 (hereinafter referred to as TG 750) which is a control circuit for controlling operations of the column circuit unit 174, the current source unit 700, the vertical scanning circuit 710, and the horizontal scanning circuit 730.

Figure 1B:
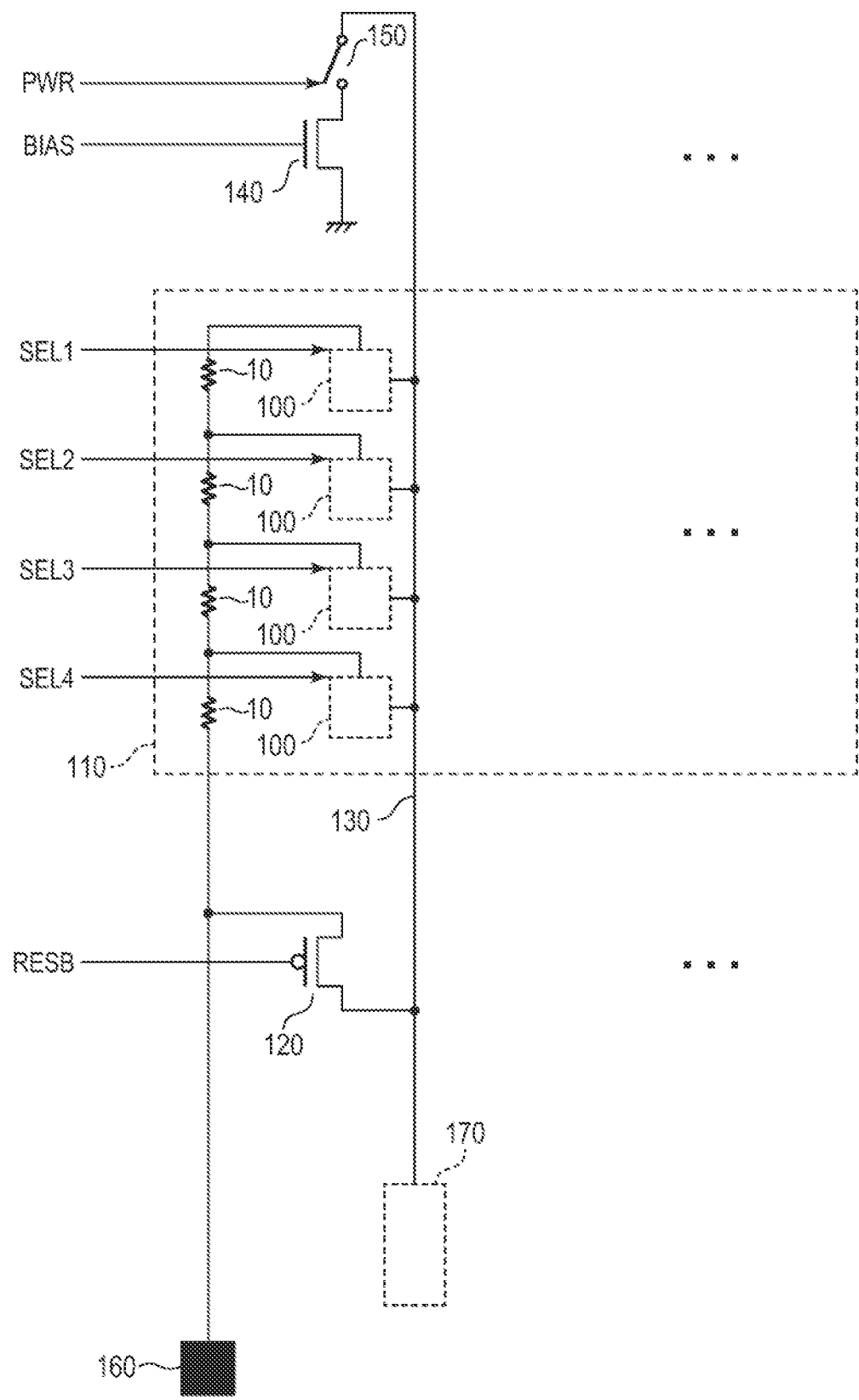
FIG. 1B a schematic diagram illustrating a configuration example of the photoelectric conversion device according to the first embodiment.

FIG. 1B is a schematic diagram illustrating a configuration example of the photoelectric conversion device according to the present embodiment. FIG. 1B illustrates the configuration of a circuit connected to a column of pixels 100 in FIG. 1A in more detail. The photoelectric conversion device includes a pixel array 110, an assisting transistor 120, a signal line 130, a current source transistor 140 (driving transistor), a switch 150, a power source pad 160, and a column circuit 170. The current source unit 700 illustrated in FIG. 1A includes the current source transistor 140 and the switch 150. The column circuit unit 174 illustrated in FIG. 1A includes a plurality of column circuits 170 arranged in each column. The operation of the switch 150 is controlled by the TG 750 illustrated in FIG. 1A.

Control signals SEL1, SEL2, . . . are input to the plurality of pixels 100 for each row from the vertical scanning circuit 710 illustrated in FIG. 1A. The number after "SEL" indicates a row number. The control signals SEL1, SEL2, . . . are examples, and the vertical scanning circuit 710 may further supply control signals other than these to the plurality of pixels 100. The vertical scanning circuit 710 may comprise a shift register or an address decoder.

A power source potential is input to the plurality of pixels 100 from a power source line connected to the power source pad 160. The parasitic resistance 10 illustrated in FIG. 1B is equivalent to the resistance parasitic on the power source line between the plurality of pixels 100.

The signal lines 130 are arranged for each column of the pixel array 110. A signal output from a pixel 100 selected by control signals SEL1, SEL2, . . . among a plurality of pixels 100 is output to a signal line 130.

The current source transistor 140 is an NMOS transistor. The switch 150 is a transistor such as NMOS, PMOS or the like. The first terminal of the switch 150 is connected to the signal line 130. The second terminal of the switch 150 is connected to the drain of the current source transistor 140. The source of the current source transistor 140 is connected to a potential line having a power source potential. The switch 150 is controlled to the ON state or the OFF state by a control signal PWR input from the TG 750 illustrated in FIG. 1A. When the switch 150 is in the ON state, the current source transistor 140 functions as a current source that supplies a driving current to the signal line 130. That is, the TG 750 for controlling the switch 150 is a current controlling unit for controlling the current amount of the driving current supplied to the signal line 130. Further, the switch 150 is a current adjusting unit for changing the current amount of the driving current under the control of the current controlling unit. A bias potential BIAS for controlling the driving current is input from the TG 750 to the gate of the current source transistor 140.

The signal line 130 is further connected to the column circuit 170. The column circuit 170 performs processing such as amplification, correlated double sampling processing and AD conversion on the pixel signal output to the signal line 130.

The assisting transistor 120 is a PMOS transistor. The source (first main electrode) of the assisting transistor 120 is connected to a power source line connected to the power source pad 160. The drain (second main electrode) of the assisting transistor 120 is connected to the signal line 130. A control signal RESB is input to the gate of the assisting transistor 120 from the TG 750 illustrated in FIG. 1A. As details will be described later, the assisting transistor 120 functions as an assisting element for assisting the fluctuation of the current flowing through the signal line 130 when the driving current is switched from the state where the driving current is disconnected to the state where the driving current is supplied.

Figure 2:
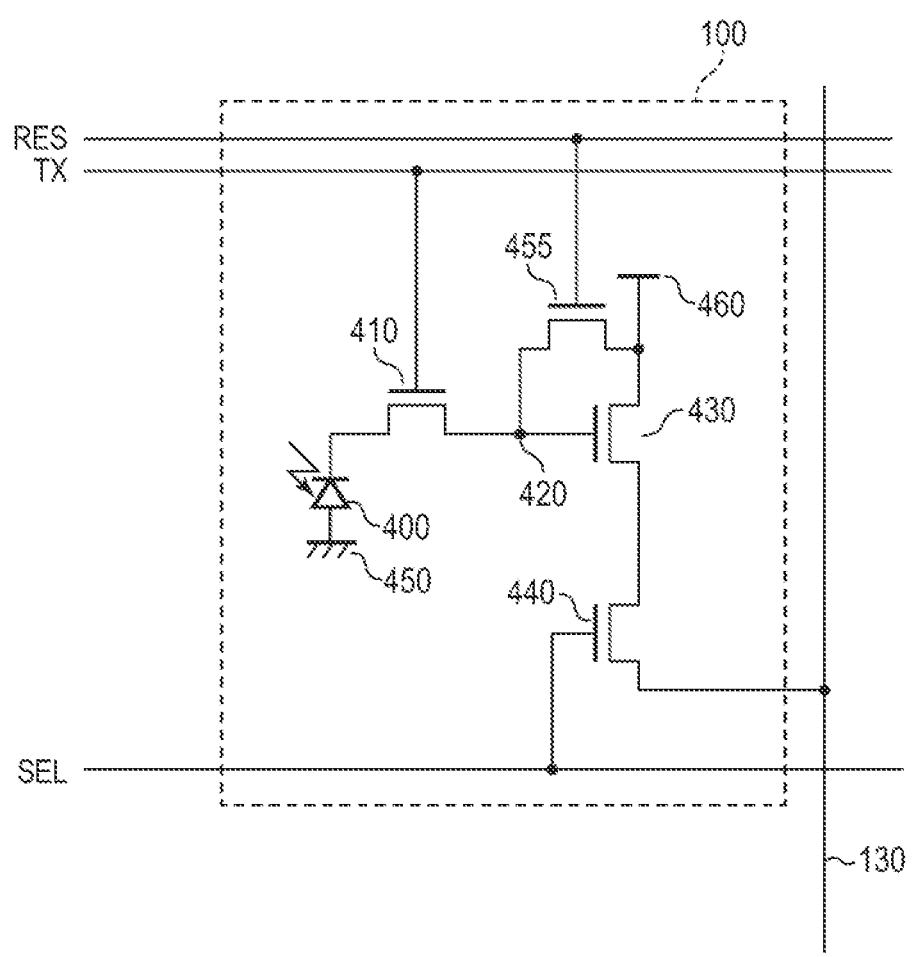
FIG. 2 is a circuit diagram illustrating a configuration example of a pixel according to the first embodiment.

FIG. 2 is a circuit diagram illustrating a configuration example of the pixel 100 according to the present embodiment. The pixel 100 includes a photoelectric conversion unit 400, a transfer transistor 410, a floating diffusion 420, a source follower transistor 430, a selection transistor 440, and a reset transistor 455. These transistors may be composed of NMOS transistors having gate electrodes as control electrodes. A control signal TX is input to the gate of the transfer transistor 410 from the vertical scanning circuit 710 illustrated in FIG. 1A. A control signal SEL (corresponds to the control signals SEL1, SEL2, . . . in FIG. 1B) is input from the vertical scanning circuit 710 to the gate of the selection transistor 440. A control signal RES is input from the vertical scanning circuit 710 to the gate of the reset transistor 455.

The photoelectric conversion unit 400 is a photoelectric conversion element that generates charges corresponding to incident light by photoelectric conversion and accumulates the charges. The photoelectric conversion unit 400 may be composed of a photodiode formed in a semiconductor substrate. An anode of a photodiode constituting the photoelectric conversion unit 400 is connected to a potential line 450 having a ground potential, and a cathode is connected to a source of a transfer transistor 410.

The drain of the transfer transistor 410, the source of the reset transistor 455, and the gate of the source follower transistor 430 are connected to the floating diffusion 420. When the transfer transistor 410 is turned on, the charge of the photoelectric conversion unit 400 is transferred to the floating diffusion 420. The floating diffusion 420 has a capacitance. With this capacitance, the potential of the floating diffusion 420 changes according to the charges transferred from the photoelectric conversion unit 400.

The drain of the reset transistor 455 and the drain of the source follower transistor 430 are connected to a potential line 460 having a power source potential. The source of the source follower transistor 430 is connected to the drain of the selection transistor 440. The source of the selection transistor 440 is connected to the signal line 130. The source follower transistor 430 constitutes a source follower circuit together with a current source transistor 140 connected to a signal line 130. The source follower circuit outputs a signal based on the potential of the floating diffusion 420 to a signal line 130 via a selection transistor 440. The reset transistor 455 is turned on to reset the potential of the floating diffusion 420.

Figure 3:
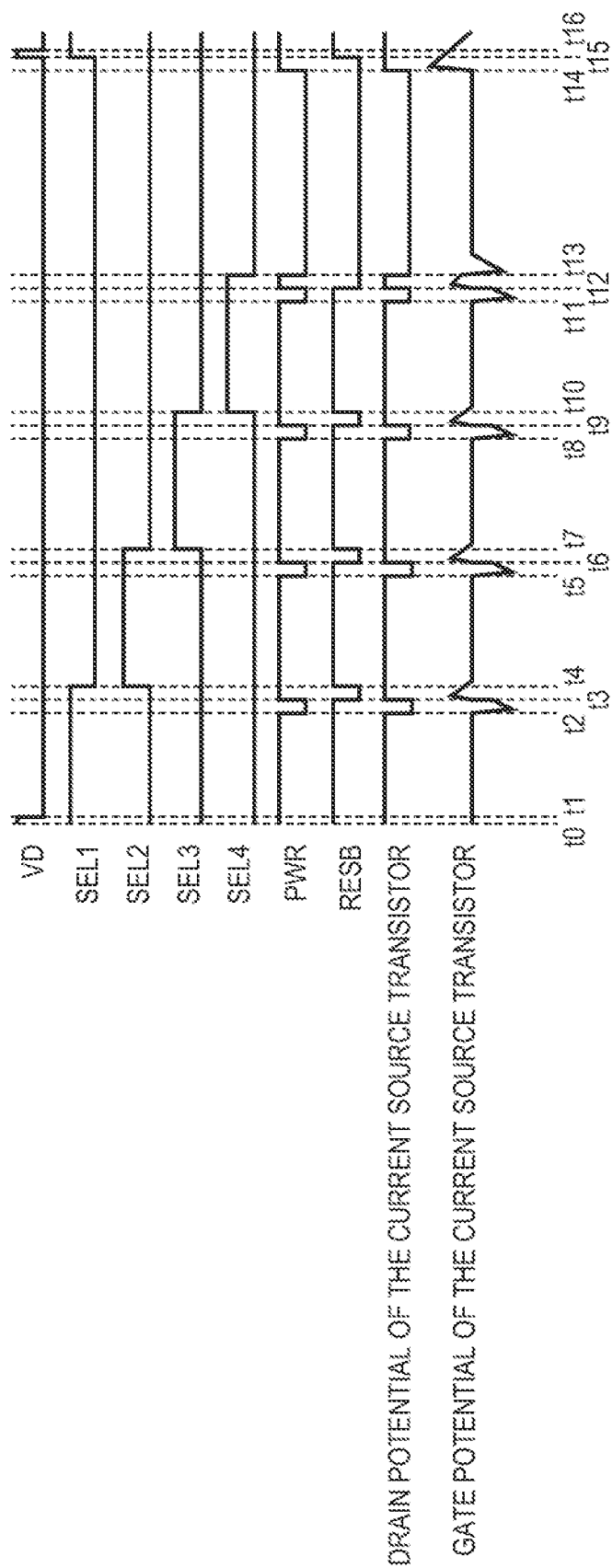
FIG. 3 is a timing chart showing the operation of the photoelectric conversion device according to the first embodiment.

FIG. 3 is a timing chart showing the operation of the photoelectric conversion device according to the present embodiment. The VD shown in FIG. 3 is a vertical synchronizing signal VD indicating the head of one frame. SEL1, . . . SEL4 shown in FIG. 3 indicate the levels of control signals SEL1, . . . SEL4 input to the gates of the selection transistors 440 included in the pixels 100. When the control signals SEL1, . . . SEL4 are at a high level, the selection transistor 440 of the corresponding row is in the ON state, and a signal is output from the pixel 100 to the signal line 130.

The PWR shown in FIG. 3 indicates the level of the control signal PWR input to the control terminal of the switch 150. When the control signal PWR is at a high level, the switch 150 is in the ON state, and when the control signal PWR is at a low level, the switch 150 is in the OFF state.

The RESB shown in FIG. 3 indicates the level of the control signal RESB input to the gate of the assisting transistor 120. When the control signal RESB is at a high level, the assisting transistor 120 is in the OFF state, and when the control signal RESB is at a low level, the assisting transistor 120 is in the ON state.

In FIG. 3, "DRAIN POTENTIAL OF THE CURRENT SOURCE TRANSISTOR" indicates the potential of the drain of the current source transistor 140, and "GATE POTENTIAL OF THE CURRENT SOURCE TRANSISTOR" indicates the potential of the gate of the current source transistor 140. The current flowing between the drain and the source of the current source transistor 140 changes according to the potential of the gate. Therefore, "GATE POTENTIAL OF THE CURRENT SOURCE TRANSISTOR" can also be understood as a current flowing between the drain and the source of the current source transistor 140.

From time t0 to time t1, the vertical synchronizing signal VD is at a high level. At this time, the control signal SEL1 is at a high level, and the control signals SEL2, . . . SEL4 are at a low level. That is, the pixels 100 in the first row are selected. At this time, since the control signal PWR is at a high level, the switch 150 is in the ON state. Since the driving current is supplied from the current source transistor 140 to the signal line 130, a signal is output from the pixel 100 of the first row to the signal line 130. At this time, the control signal RESB is at a high level, and the assisting transistor 120 is in the OFF state.

Then, the signal output to the signal line 130 in the reading of the first row continues until the time t2. At time t2 when the signal output from the pixels 100 in the first row to the signal line 130 is completed, the control signal PWR becomes a low level. As a result, the switch 150 is turned off, and the driving current from the current source transistor 140 to the signal line 130 is disconnected.

At time t3, the control signal PWR becomes a high level. As a result, the switch 150 is turned on, and the driving current is supplied from the current source transistor 140 to the signal line 130 again. At time t3, the control signal RESB becomes a low level. As a result, the assisting transistor 120 is turned on, and the power source line and the signal line 130 are electrically connected. The effect of this operation will be described later.

At time t4, the control signal RESB becomes a high level. Thus, the assisting transistor 120 is turned off, and the electrical connection between the power source line and the signal line 130 is disconnected. At time t4, the control signal SEL1 becomes a low level and the control signal SEL2 becomes a high level. Thus, the pixels 100 in the first row are deselected, and the pixels 100 in the second row are selected.

In the period from time t4 to time t7, reading is performed for the pixels 100 of the second row in the same manner as for the pixel 100 of the first row. In the period from time t7 to time t10, the pixels 100 in the third row are read out, and in the period from time t10 to time t13, the pixels 100 in the fourth row are read out. The reading operation of the second to fourth rows is the same as that of the first row, and therefore the description thereof is omitted.

At time t13, the control signal SEL4 becomes a low level, and the pixels 100 in the fourth row are deselected. Then, the period until the time t15 when the vertical synchronizing signal VD becomes a high level again and the reading of the pixels 100 of the first row is started is a period in which the pixels 100 of any row are not read out. In the period from time t13 to time t14, the control signal PWR is at a low level. As a result, the switch 150 is in the OFF state, and no current flows from the current source transistor 140 to the signal line 130.

As described above, in the present embodiment, the switch 150 is in the OFF state during the periods from time t2 to time t3, from time t5 to time t6, from time t8 to time t9, from time t11 to time t12, and from time t13 to time t14. These periods are periods from the completion of signal output from the pixels 100 of a row to the signal line 130 to the start of signal output from the pixels 100 of the next row to the signal line 130. During these periods, it is not necessary to supply a driving current to the signal line 130. Therefore, in the present embodiment, the current supply from the current source transistor 140 to the signal line 130 is discontinued during a period in which it is not necessary to supply the driving current to the signal line 130 as in these periods. This reduces power consumption.

However, as the switch 150 is switched, an overshoot current may occur in the current source transistor 140. The cause of the generation of the overshoot current and the effect on the signal quality will be described.

As shown in FIG. 3, during the period when the switch 150 is in the OFF state, the drain potential of the current source transistor 140 decreases to a level close to the ground potential. Although a constant bias potential BIAS is applied to the gate of the current source transistor 140, this bias potential BIAS is applied via a finite impedance. Therefore, when the drain potential fluctuates, the gate potential of the current source transistor 140 may also be affected transiently through the parasitic capacitance. More specifically, around time t2 in FIG. 3, immediately after the drain potential decreases, the gate potential also decreases. Further, around time t3 in FIG. 3, the gate potential also increases immediately after the drain potential increases.

When the gate potential increases, an overshoot current flows between the drain and the source of the current source transistor 140. When the overshoot current flows through the pixel array 110, the power source potential of the pixel 100 decreases due to the influence of the parasitic resistance 10. Since it takes a certain amount of time for the reduction in the power source potential to return to the original state, the reduction in the power source potential may affect the quality of the signal read out from the pixel 100. Further, since the reduction amount of the power supply potential is different for each pixel 100, the influence on the quality of the signal is different for each pixel 100.

In contrast, in the present embodiment, an assisting transistor 120 is provided for electrically connecting a power source line connected to the power source pad 160 and the signal line 130. The assisting transistor 120 is controlled so as to be turned on when the switch 150 shifts from the OFF state to the ON state, that is, when the drain potential of the current source transistor 140 increases. The assisting transistor 120 assists the fluctuation of the current flowing through the signal line 130 at this time. More specifically, a part or all of the overshoot current generated in the current source transistor 140 flows from the power source pad 160 through the assisting transistor 120 to the signal line 130, thereby assisting the fluctuation of the current. Thus, the amount of the overshoot current flowing through the pixel array 110 is reduced, and the fluctuation of the power source potential of the pixel 100 is also reduced. In this way, signal quality deterioration due to switching of the switch 150 is reduced.

As described above, according to the present embodiment, a photoelectric conversion device in which signal quality deterioration due to power source potential fluctuation is reduced is provided.

As illustrated in FIG. 1B, a PMOS transistor is used as the assisting transistor 120. As a result, the effect of reducing the overshoot current flowing into the pixel array 110 can be enhanced as compared with the case where an NMOS transistor is used. When the assisting transistor 120 is turned on, the potential of the signal line 130 is the power supply potential. Since the maximum potential of the floating diffusion 420 in the pixel 100 is the power supply potential, the gate-source voltage Vgs of the source follower transistor 430 is approximately 0 V at the maximum. Therefore, the overshoot current flowing through the pixel array 110 can be effectively reduced.

However, the assisting transistor 120 is not limited to a PMOS transistor, and may be an NMOS transistor. When the assisting transistor 120 is an NMOS transistor, it is desirable that the threshold of the assisting transistor 120 be set as low as possible. In particular, it is more desirable to make the threshold of the assisting transistor 120 lower than the threshold of the source follower transistor 430. Thus, more overshoot current can flow through the assisting transistor 120, and the overshoot current flowing through the pixel array 110 can be reduced.

Second Embodiment

The photoelectric conversion device of the present embodiment is a modified example in which the current source transistor 140 and the switch 150 are arranged in different positions. The positions other than those of the current source transistor 140 and the switch 150 are the same as those of the first embodiment, and a description thereof will be omitted.

Figure 4:
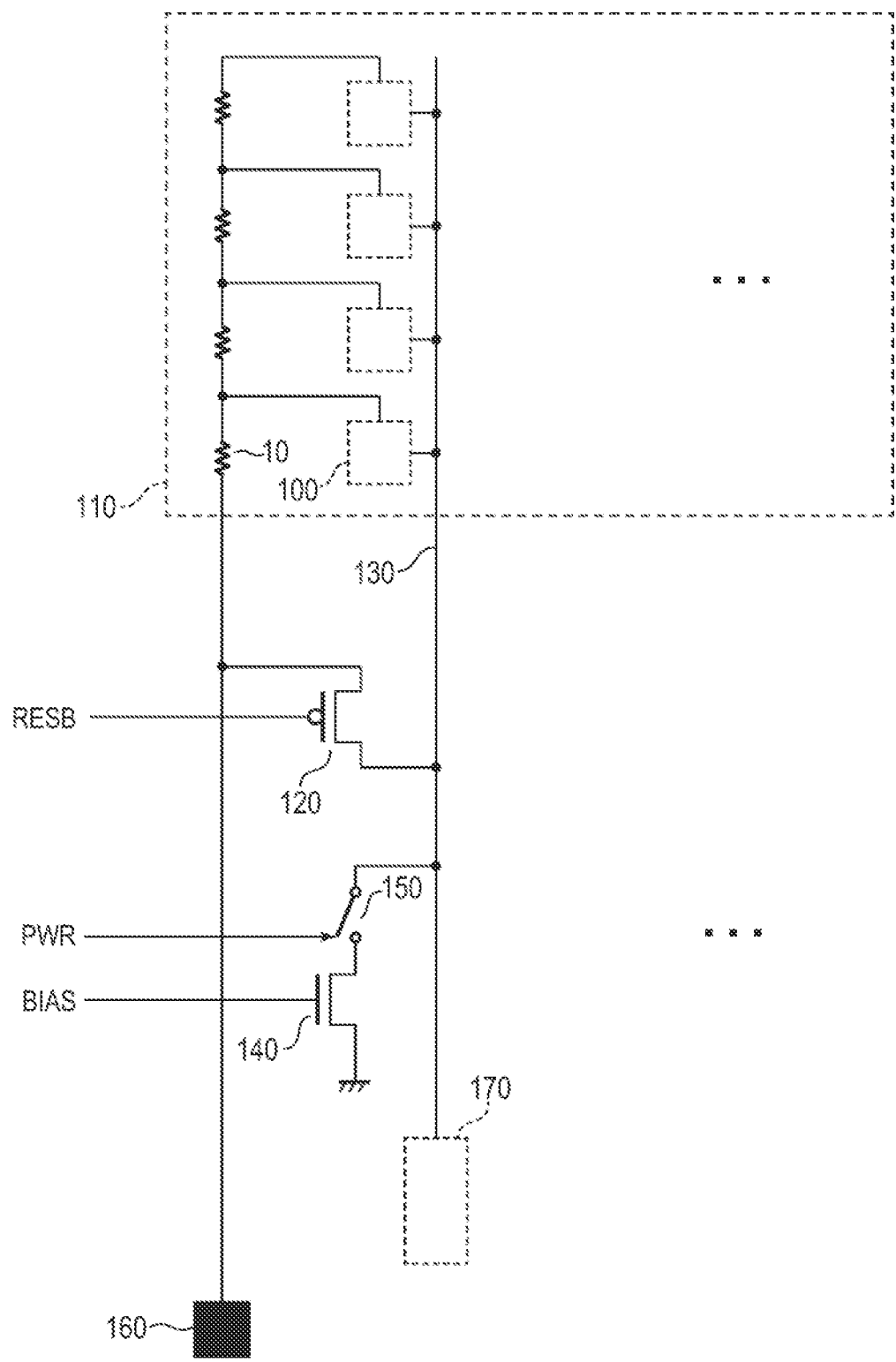
FIG. 4 is a schematic diagram illustrating a configuration example of a photoelectric conversion device according to a second embodiment.

FIG. 4 is a schematic diagram illustrating a configuration example of a photoelectric conversion device according to the present embodiment. In FIG. 4, SEL1, SEL2, . . . are not shown.

As illustrated in FIG. 4, in the present embodiment, in the direction in which the signal line 130 extends, the current source transistor 140 and the switch 150 are arranged on the same side as the assisting transistor 120 with respect to the pixel array 110. Thus, when the overshoot current of the current source transistor 140 flows through the assisting transistor 120, the current does not pass through the pixel array 110. Therefore, the influence of the overshoot current on the pixel 100 can be further reduced.

As described above, according to the present embodiment, a photoelectric conversion device in which signal quality deterioration caused by power source potential fluctuation is further reduced is provided.

Third Embodiment

Figure 5:
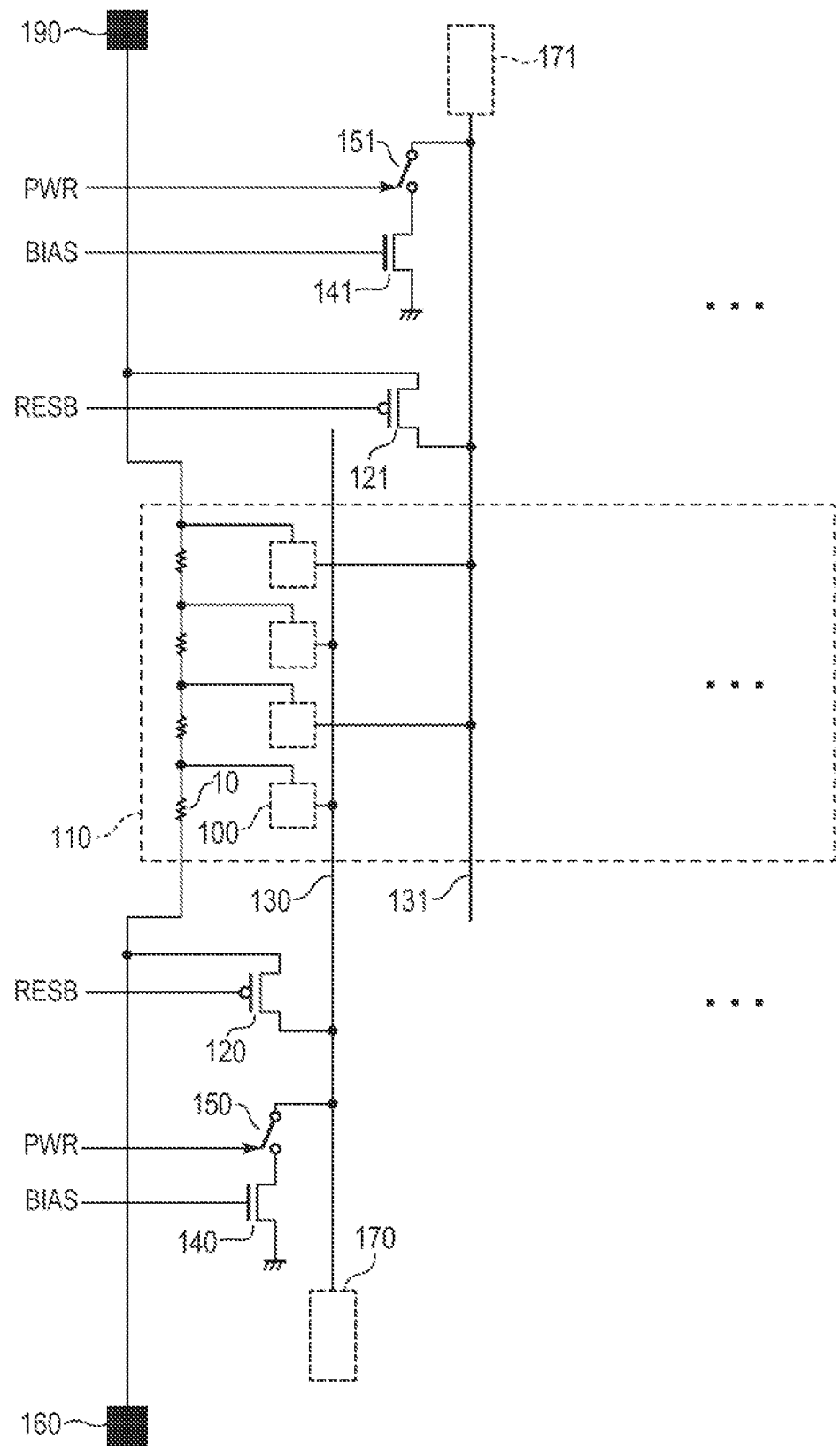
FIG. 5 is a schematic diagram illustrating a configuration example of a photoelectric conversion device according to a third embodiment.

FIG. 5 is a schematic diagram illustrating a configuration example of a photoelectric conversion device according to the present embodiment. In addition to the photoelectric conversion device of the second embodiment, the photoelectric conversion device of the present embodiment further includes an assisting transistor 121, a signal line 131, a current source transistor 141, a switch 151, a column circuit 171, and a power source pad 190. The other configurations are generally the same except for the ones to be noted, and therefore description thereof is omitted.

In the present embodiment, two signal lines 130 and 131 are arranged for the pixels 100 of one column. The signal line 130 (first signal line) extends in the downward direction (first direction) in FIG. 5, and the signal line 131 (second signal line) conversely extends in the upward direction (second direction) in FIG. 5. Signals output from the pixels 100 of the even-numbered rows are output to a signal line 130, and signals output from the pixels 100 of the odd-numbered rows are output to a signal line 131.

The assisting transistor 121, the current source transistor 141, the switch 151, and the column circuit 171 are arranged on opposite sides of the assisting transistor 120, the current source transistor 140, the switch 150, and the column circuit 170 with respect to the pixel array 110. In other words, these circuit groups for reading are arranged corresponding to each of the two signal lines 130 and 131. Since the connection relationship among the assisting transistor 121, the signal line 131, the current source transistor 141, the switch 151, the column circuit 171, and the power source pad 190 is the same as the connection relationship among the signal line 130, the current source transistor 140, or the like, a description thereof will be omitted. The power source pad 160 (first power source pad) and the power source pad 190 (second power source pad) are arranged on the opposite side to the pixel array 110, and are electrically connected to each other by a power source line via a parasitic resistance 10 in the pixel array 110.

In the present embodiment, the signals from the pixels 100 of the even-numbered rows are read out by the signal line 130, and the signals from the pixels 100 of the odd-numbered rows are read out by the signal line 131, so that two rows can be read out in parallel. Accordingly, a photoelectric conversion device having a high readout speed is provided.

In the present embodiment, the two power source pads 160 and 190 are connected to each other via a parasitic resistance 10 in the pixel array 110. This makes it difficult for a current to flow in a path from the power source pad 160 to the assisting transistor 121 via the parasitic resistance 10, and reduces a fluctuation in power source potential caused by the current flow.

Fourth Embodiment

Figure 6:
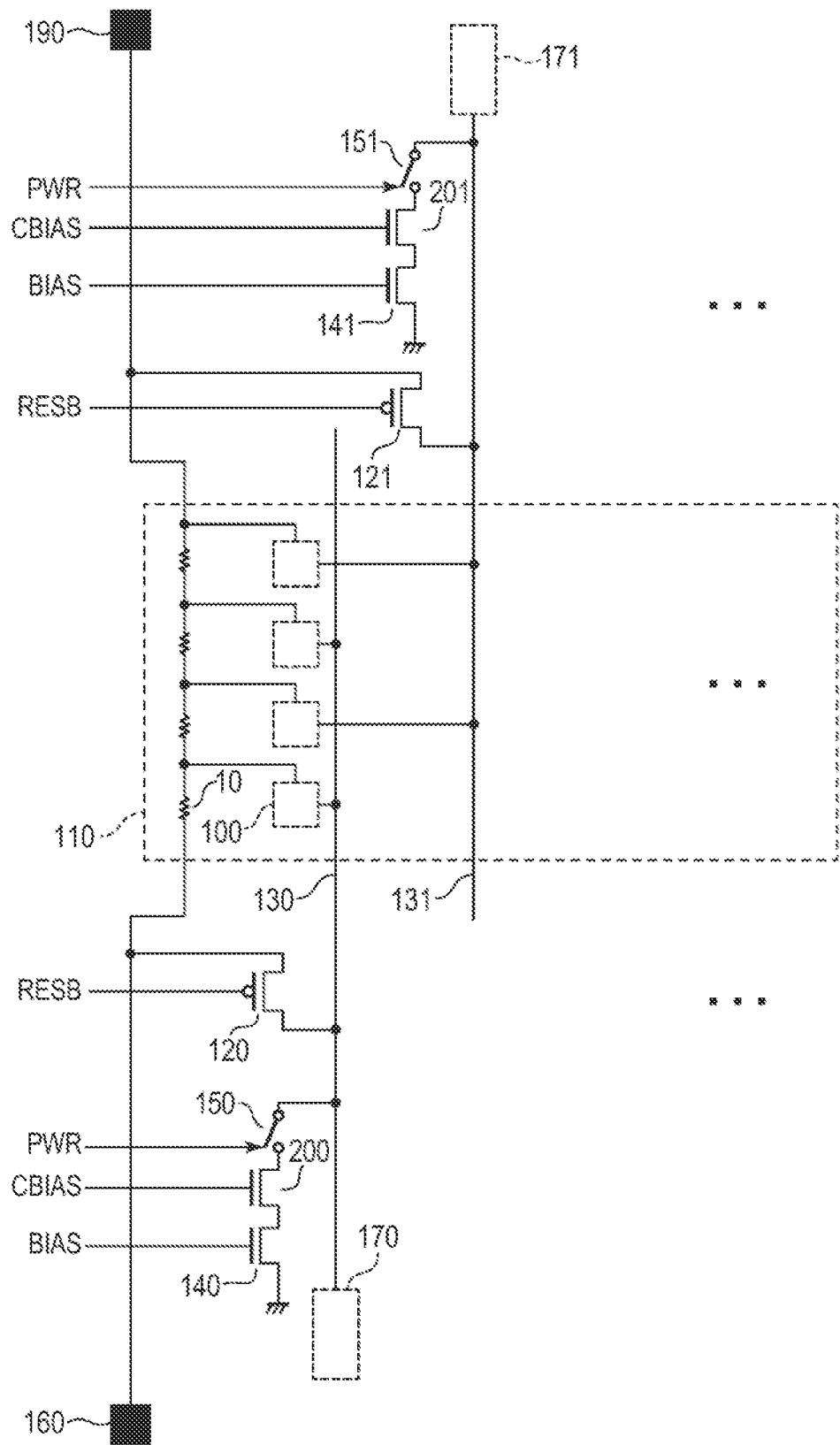
FIG. 6 is a schematic diagram illustrating a configuration example of a photoelectric conversion device according to a fourth embodiment.

FIG. 6 is a schematic diagram illustrating a configuration example of a photoelectric conversion device according to the present embodiment. The photoelectric conversion device of the present embodiment further includes cascode transistors 200 and 201 in addition to the photoelectric conversion device of the third embodiment. The other configurations are generally the same except for the ones to be noted, and therefore description thereof is omitted.

The cascode transistors 200 and 201 are NMOS transistors. The source of the cascode transistor 200 is connected to the drain of the current source transistor 140. The drain of the cascode transistor 200 is connected to the second terminal of the switch 150. The bias potential CBIAS is input to the gate of the cascode transistor 200 from the TG 750 illustrated in FIG. 1A. Thus, the cascode transistor 200 and the current source transistor 140 are cascode-connected, and the plurality of transistors cooperate to function as a current source.

Since the connection relationship among the cascode transistor 201, the current source transistor 141, and the switch 151 is the same as the connection relationship among the cascode transistor 200, the current source transistor 140, and the switch 150, a description thereof will be omitted. That is, the cascode transistor 201 and the current source transistor 141 are cascode-connected.

In the present embodiment, cascode transistors 200 and 201 cascode-connected to current source transistors 140 and 141 are arranged. This reduces the amount of increase in the drain potential of the current source transistors 140 and 141 when the switches 150 and 151 are turned on. Therefore, since the overshoot current generated in the current source transistors 140 and 141 is reduced, the power source potential fluctuation of the pixel 100 is also reduced.

As described above, according to the present embodiment, a photoelectric conversion device in which signal quality deterioration caused by power source potential fluctuation is further reduced is provided.

Fifth Embodiment

Figure 7:
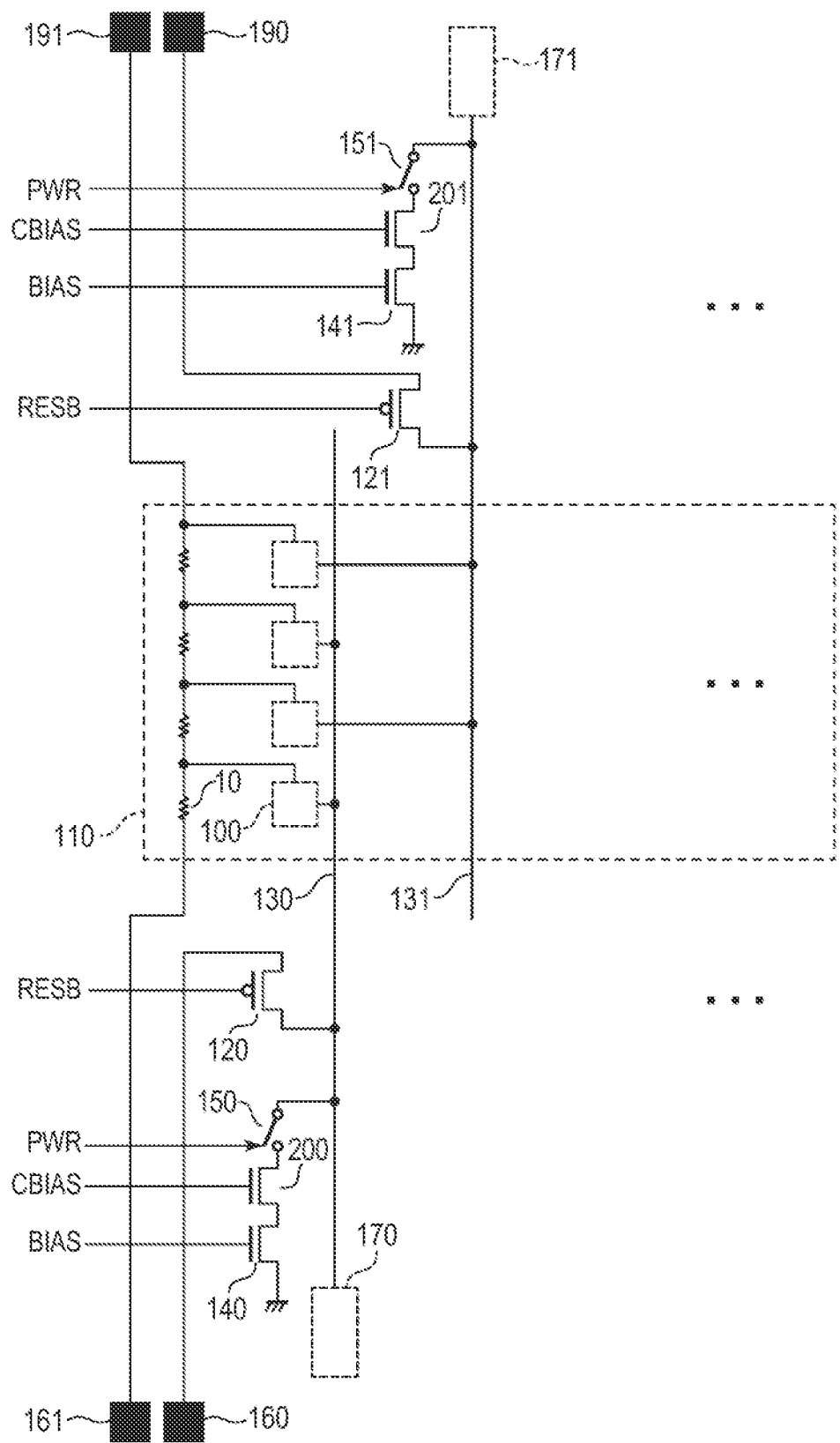
FIG. 7 is a schematic diagram illustrating a configuration example of a photoelectric conversion device according to a fifth embodiment.

FIG. 7 is a schematic diagram illustrating a configuration example of a photoelectric conversion device according to the present embodiment. The photoelectric conversion device of the present embodiment includes power source pads 161 and 191 in addition to power source pads 160 and 190 in the photoelectric conversion device of the fourth embodiment. The other configurations are generally the same except for the ones to be noted, and therefore description thereof is omitted.

In the present embodiment, the power source pad 160 is connected to the drain of the assisting transistor 120, and the power source pad 161 is connected to the power source line. Further, the power source pad 161 and the power source pad 191 are arranged on the opposite side to the pixel array 110, and are electrically connected to each other by a power source line via a parasitic resistance 10 in the pixel array 110. The power source pad 160 (first power source pad) and the power source pad 161 (third power source pad) are electrically separated on the substrate on which they are arranged, and the power source pad 190 and the power source pad 191 are also electrically separated on the substrate.

As described above, in the present embodiment, the power source pads 161 and 191 for supplying the power source potential to the pixel array 110 and the power source pads 160 and 190 for supplying the power source potential to the assisting transistors 120 and 121 are independently arranged. These power source pads are electrically separated on the substrate. Thus, when current flows through the assisting transistors 120 and 121, the influence hardly reaches the pixel 100. Therefore, the influence of the overshoot current on the pixel 100 can be further reduced.

As described above, according to the present embodiment, a photoelectric conversion device in which signal quality deterioration caused by power source potential fluctuation is further reduced is provided.

Sixth Embodiment

Figure 8:
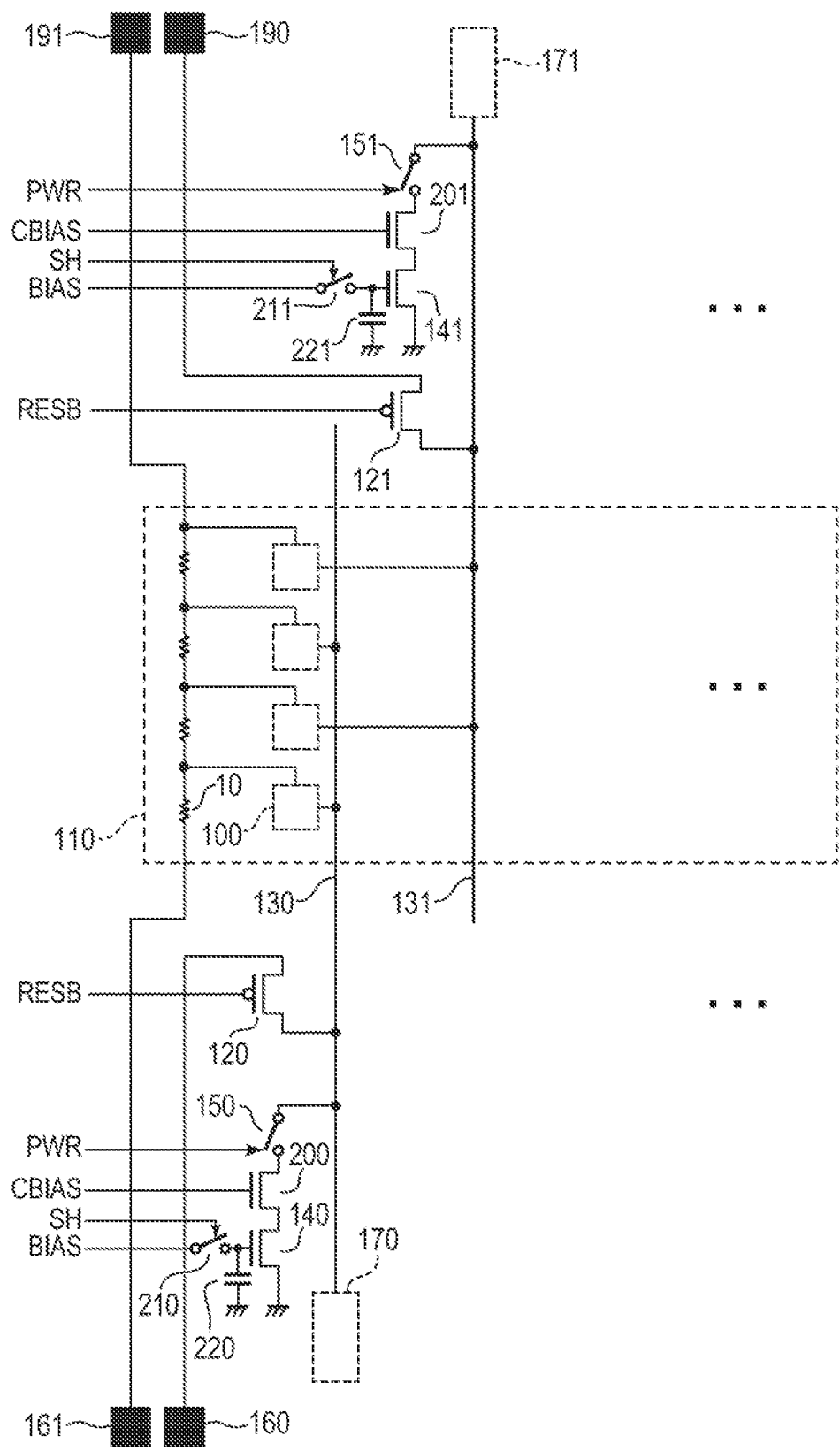
FIG. 8 is a schematic diagram illustrating a configuration example of a photoelectric conversion device according to a sixth embodiment.

FIG. 8 is a schematic diagram illustrating a configuration example of a photoelectric conversion device according to the present embodiment. In addition to the photoelectric conversion device of the fifth embodiment, the photoelectric conversion device of the present embodiment further includes switches 210 and 211 and capacitive elements 220 and 221. The other configurations are generally the same except for the ones to be noted, and therefore description thereof is omitted.

The first terminal of the switch 210 and the first terminal of the capacitive element 220 are connected to the gate of the current source transistor 140. The second terminal of the capacitive element 220 is connected to a potential line having a ground potential. The bias potential BIAS is input to the second terminal of the switch 210 from the TG 750 illustrated in FIG. 1A. The switch 210 is controlled by a control signal SH input from the TG 750. Thus, the switch 210 and the capacitive element 220 form a sample and hold circuit for holding the bias potential BIAS.

Since the connection relationship among the current source transistor 141, the switch 211, and the capacitive element 221 is the same as the connection relationship among the current source transistor 140, the switch 210, and the capacitive element 220, a description thereof will be omitted. That is, the switch 211 and the capacitive element 221 form a sample and hold circuit for holding the bias potential BIAS.

In the present embodiment, by holding the bias potential BIAS in the capacitive elements 220 and 221, it is possible to reduce fluctuations in the currents of the current source transistors 140 and 141 caused by fluctuations in the ground potential.

Figure 9:
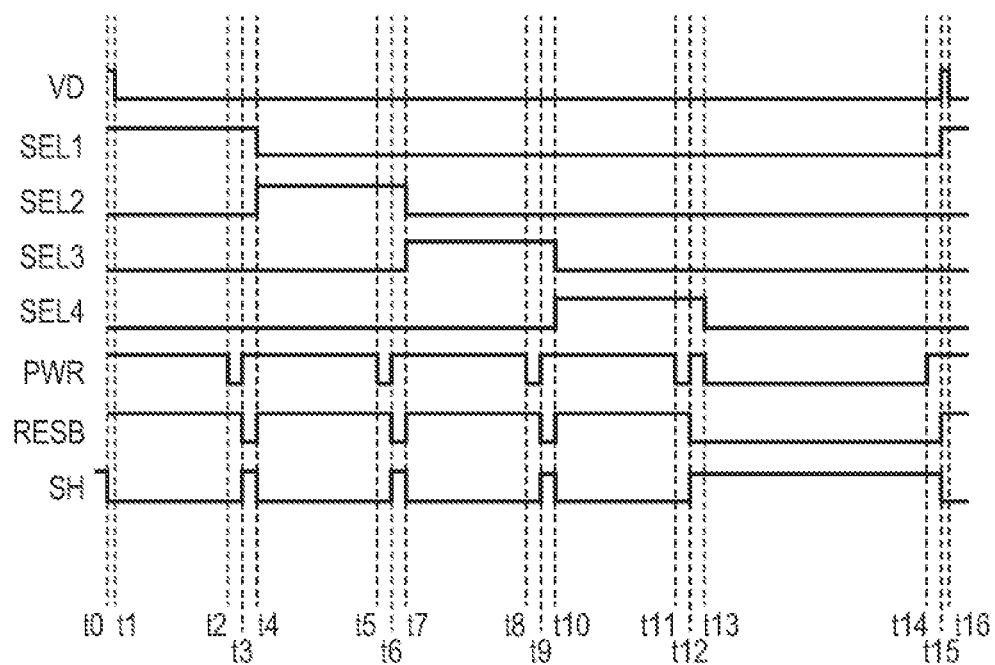
FIG. 9 is a timing chart showing the operation of the photoelectric conversion device according to the sixth embodiment.

Next, an example of a specific driving method of the sample and hold circuit in the present embodiment will be described. FIG. 9 is a timing chart showing the operation of the photoelectric conversion device according to the present embodiment. SH in FIG. 9 indicates the level of the control signal SH input to the control terminals of the switches 210 and 211. When the control signal SH is at a high level, the switches 210 and 211 are in the ON state, and when the control signal SH is at a low level, the switches 210 and 211 are in the OFF state. The other components are the same as those in FIG. 3, and therefore description thereof will be omitted.

As shown in FIG. 9, the period in which the control signal SH is at a high level is from time t3 to time t4, from time t6 to time t7, from time t9 to time t10, and from time t12 to time t15. These periods are the periods in which the drain potentials of the current source transistors 140 and 141 increase and an overshoot current may occur, and also coincide with the periods in which the control signal RESB is at a low level, that is, the periods in which the assisting transistors 120 and 121 are in the ON state. As described above, in the present embodiment, the bias potential BIAS is sampled at the timing when the drain potential of the current source transistors 140 and 141 increases. Thus, in the present embodiment, the potential fluctuation amount of the capacitive elements 220 and 221 caused by the increase in the drain potential of the current source transistors 140 and 141 is reduced, and the overshoot current is reduced.

Seventh Embodiment

Figure 10:
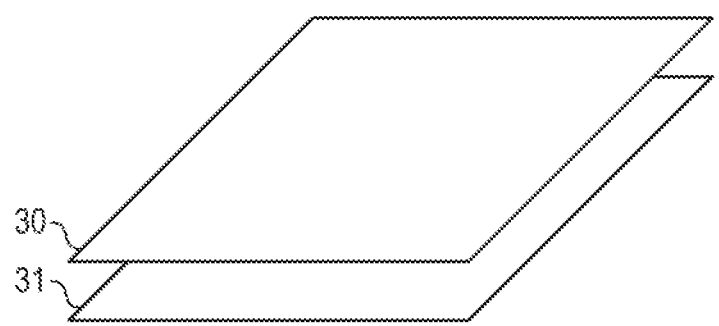
FIG. 10 is a perspective view diagram illustrating a general configuration of a photoelectric conversion device according to a seventh embodiment.

FIG. 10 is a perspective view illustrating a general configuration of the photoelectric conversion device according to the present embodiment. The photoelectric conversion device of the present embodiment is a stacked imaging device in which a plurality of substrates are stacked. The photoelectric conversion device includes a pixel substrate 30 (first substrate) and a circuit substrate 31 (second substrate) stacked on each other. Next, the configurations of the pixel substrate 30 and the circuit substrate 31 will be described with reference to FIGS. 11 and 12. Note that the circuit configuration of the photoelectric conversion device of the present embodiment is generally the same as that of the third embodiment, and the duplicate description will be omitted or simplified.

Figure 11:
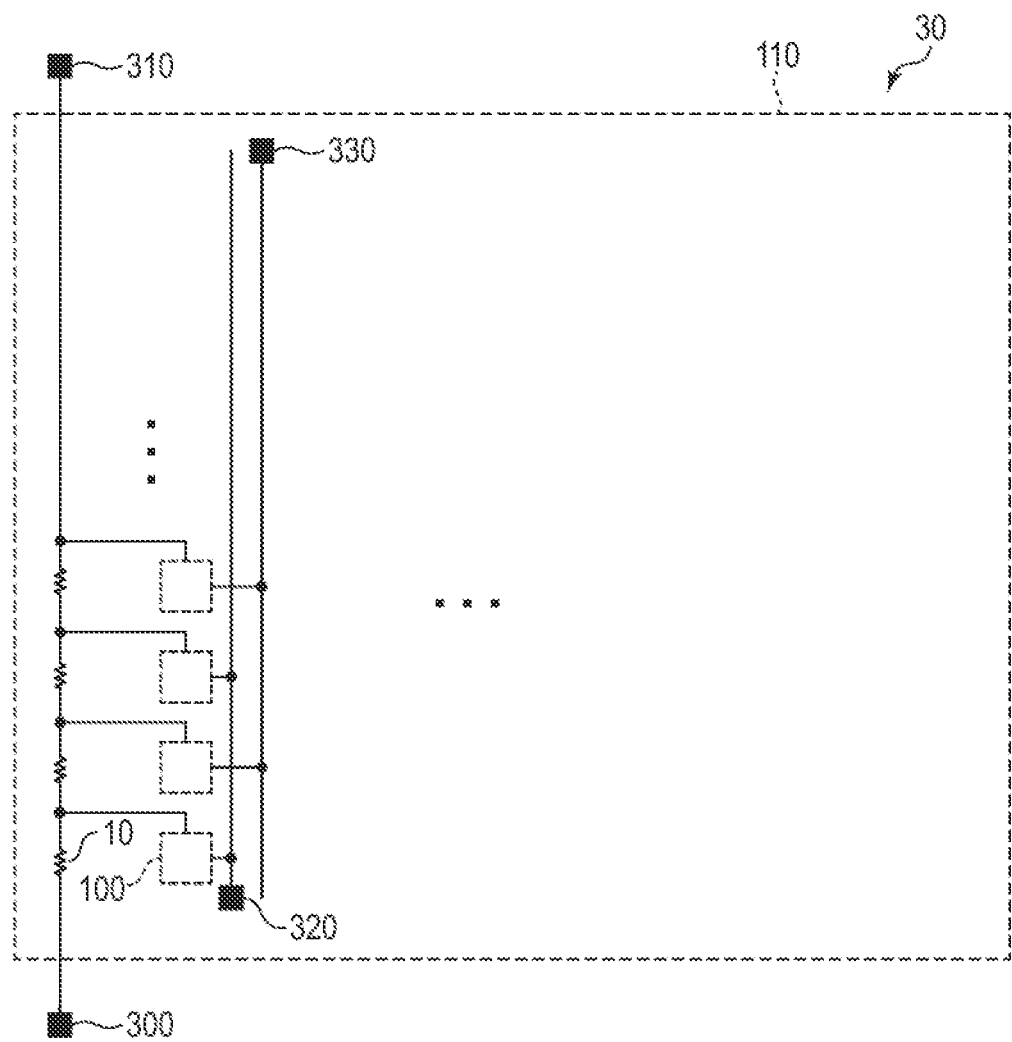
FIG. 11 is a schematic diagram illustrating a configuration example of a pixel substrate of the photoelectric conversion device according to the seventh embodiment.
Figure 12:
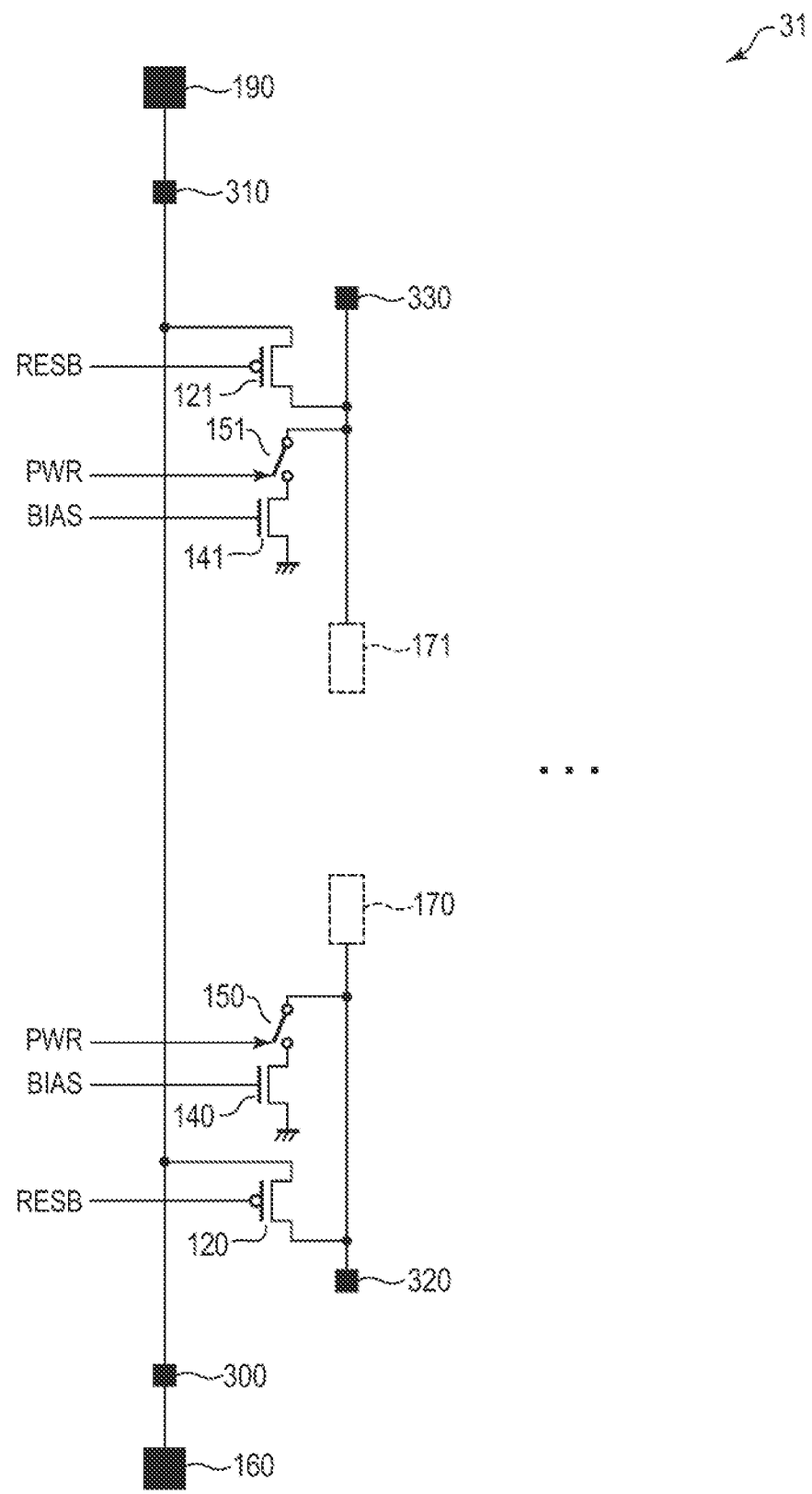
FIG. 12 is a schematic diagram illustrating a configuration example of a circuit substrate of the photoelectric conversion device according to the seventh embodiment.

FIG. 11 is a schematic diagram illustrating a configuration example of the pixel substrate 30 of the photoelectric conversion device according to the present embodiment, and FIG. 12 is a schematic diagram illustrating a configuration example of the circuit substrate 31 of the photoelectric conversion device according to the present embodiment. The pixel substrate 30 includes a pixel array 110 and signal lines 130 and 131. The circuit substrate 31 includes assisting transistors 120 and 121, current source transistors 140 and 141, switches 150 and 151, power source pads 160 and 190, and column circuits 170 and 171.

The signal line 130 of the pixel substrate 30 is connected to the assisting transistor 120, the switch 150 and the column circuit 170 of the circuit substrate 31 through an inter-substrate junction 320. The signal line 131 of the pixel substrate 30 is connected to the assisting transistor 121, the switch 151 and the column circuit 171 of the circuit substrate 31 through an inter-substrate junction 330. The power source line of the pixel substrate 30 and the power source pad 160 of the circuit substrate 31 are connected through an inter-substrate junction 300. The power source line of the pixel substrate 30 and the power source pad 190 of the circuit substrate 31 are connected through an inter-substrate junction 310.

In the present embodiment, the pixel array 110 is arranged on the pixel substrate 30, and the assisting transistors 120 and 121 are arranged on the circuit substrate 31. Thus, when the overshoot current flows through the assisting transistors 120 and 121, the current hardly flows into the power source line on the pixel substrate 30 on which the pixel array 110 is arranged.

Therefore, according to the present embodiment, a photoelectric conversion device in which signal quality deterioration caused by power source potential fluctuation is further reduced is provided.

When the assisting transistors 120 and 121 are PMOS transistors, since the assisting transistors 120 and 121 are arranged on the circuit substrate 31, PMOS transistors need not be formed on the pixel substrate 30 side. Thus, in the configuration of the present embodiment, the manufacturing cost of the pixel substrate 30 is reduced as compared with the case where both PMOS transistors and NMOS transistors are formed on the pixel substrate 30.

In the present embodiment, the configuration of the pixel substrate 30 and the circuit substrate 31 is an example, and the configurations of other embodiments described above may be combined. For example, one or more of the cascode transistors 200 and 201 of the fourth embodiment, the power source pads 161 and 191 of the fifth embodiment, the switches 210 and 211 of the sixth embodiment, the capacitive elements 220 and 221, or the like may be further provided. In that case, each of those elements may typically be arranged on the circuit substrate 31.

Eighth Embodiment

Figure 13:
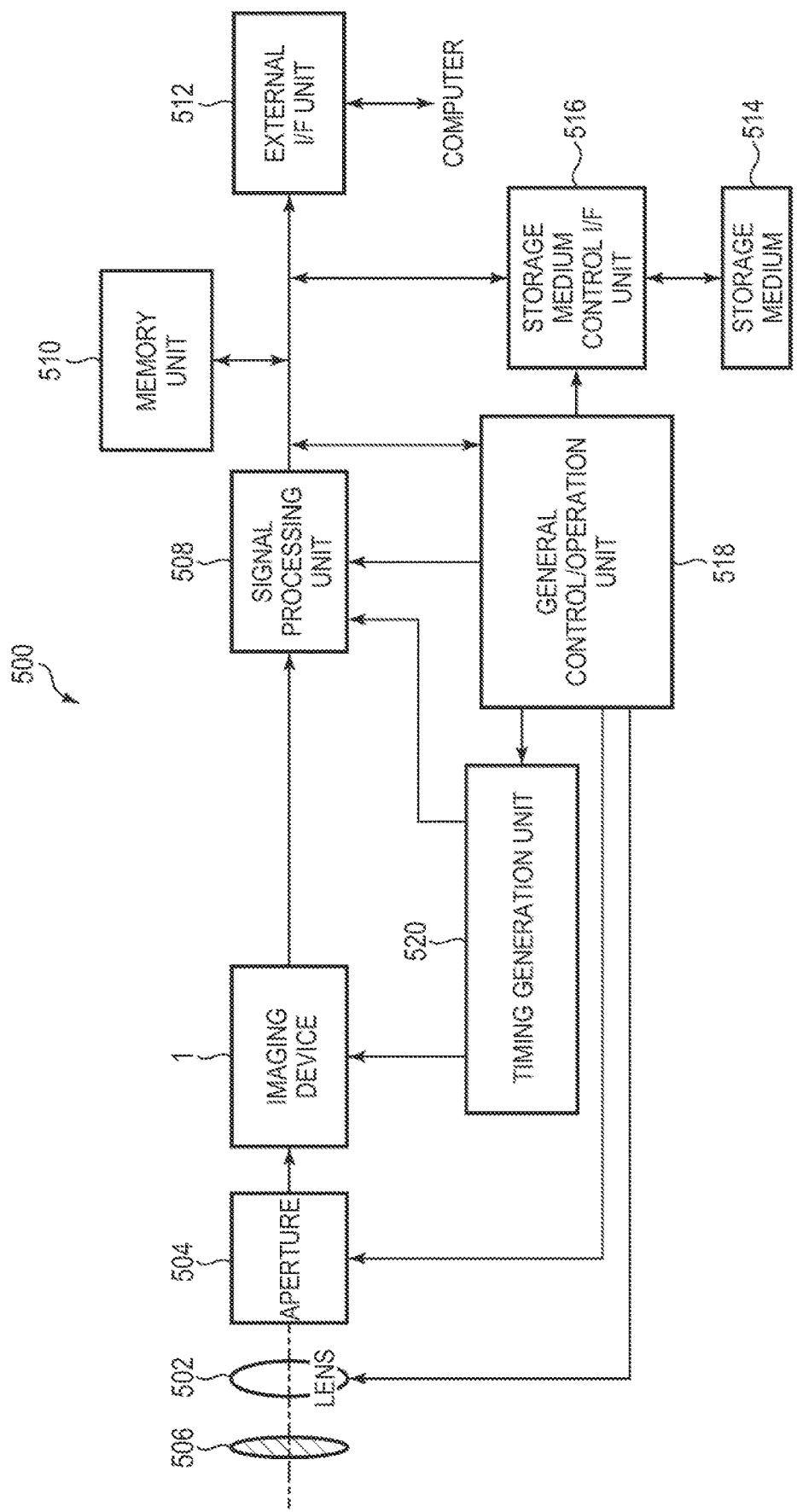
FIG. 13 is a block diagram illustrating a configuration example of an imaging system according to an eighth embodiment.

An imaging system according to an eighth embodiment of the present disclosure will be described with reference to FIG. 13. FIG. 13 is a block diagram illustrating a schematic configuration of an imaging system according to the present embodiment. The imaging device 1 illustrated in FIG. 13 is the photoelectric conversion device described in the above-described first to seventh embodiments. That is, the imaging system 500 according to the present embodiment is an example of a photoelectric conversion system to which the photoelectric conversion device described in the above-described first to seventh embodiments may be applied.

The imaging system 500 according to the present embodiment is not limited to, but can be applied to digital still cameras, digital camcorders, camera heads, copiers, fax machines, mobile phones, in-vehicle cameras, observation satellites or the like.

The imaging system 500 illustrated in FIG. 13 includes an imaging device 1, a lens 502, an aperture 504, a barrier 506, a signal processing unit 508, a timing generation unit 520, a general control/operation unit 518. Further, the imaging system 500 includes a memory unit 510, storage medium control I/F unit 516, and an external I/F unit 512.

The lens 502 captures an optical image of an object onto a pixel array 110 of the imaging device 1. The aperture 504 changes a light amount passing through the lens 502. The barrier 506 protects the lens 502. The imaging device 1 is configured as photoelectric conversion device in the above-described embodiment, and outputs a signal based on the optical image captured by the lens 502 to the signal processing unit 508.

The signal processing unit 508 performs desired processes, correction, data compression, or the like on the signal output from the imaging device 1. The signal processing unit 508 may be mounted on the same substrate as the imaging device 1, or may be mounted on another substrate. Further, a part of the function of the signal processing unit 508 may be mounted on the same substrate as the imaging device 1, and another part of the function of the signal processing unit 508 may be mounted on another substrate. The imaging device 1 may output not a digital signal but an analog signal before AD conversion. In this case, the signal processor 508 may further include an AD converter.

The timing generation unit 520 outputs various timing signals to the imaging device 1 and the signal processing unit 508. The general control/operation unit 518 is a control unit that controls driving and arithmetic processes of the entire imaging system 500. Herein, the timing signal or the like may be input from the outside of the imaging system 500, and the imaging system 500 may include at least the imaging device 1 and the signal processing unit 508 for processing the imaging signal output from the imaging device 1.

The memory unit 510 is a frame memory unit for temporarily storing image data. The storage medium control I/F unit 516 is an interface unit for recording or reading image data on or from the storage medium 514. The external I/F unit 512 is an interface unit for communicating with an external computer or the like. The storage medium 514 is a removable storage medium such as a semiconductor memory for recording or reading image data.

Thus, by configuring the imaging system 500 to which the photoelectric conversion device according to the first to seventh embodiments are applied, a high-performance imaging system capable of acquiring a high-quality image can be realized.

Ninth Embodiment

Figure 14A:
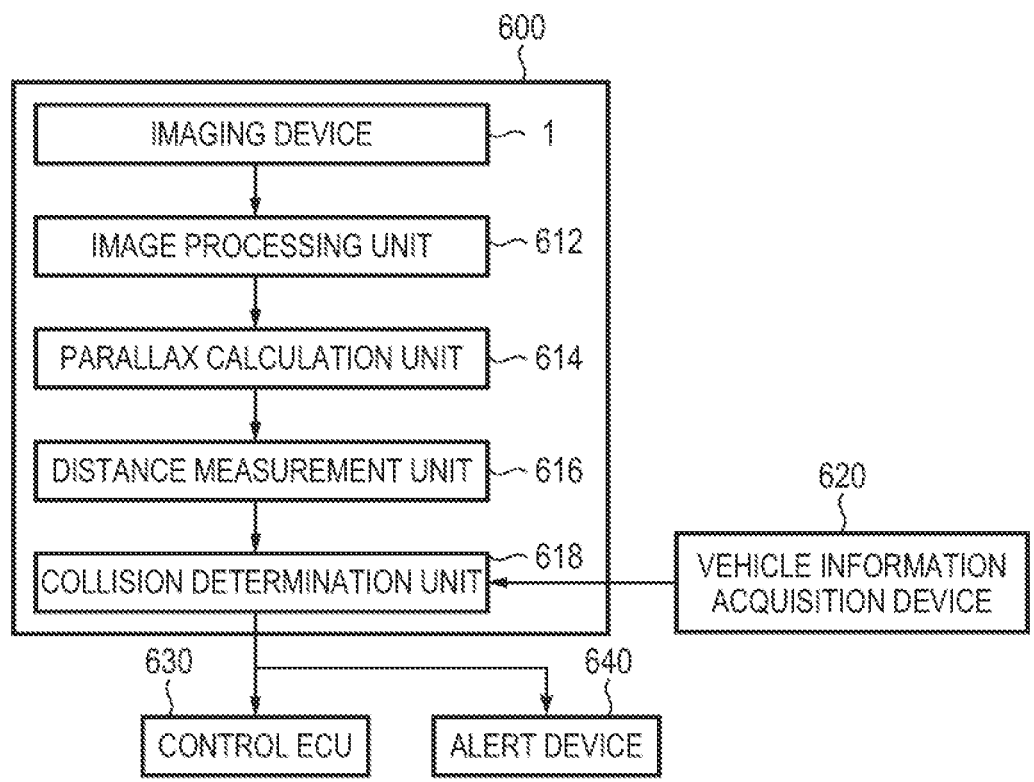
FIG. 14A and FIG. 14B are diagrams illustrating a configuration example of an imaging system and a moving body according to a ninth embodiment.
Figure 14B:
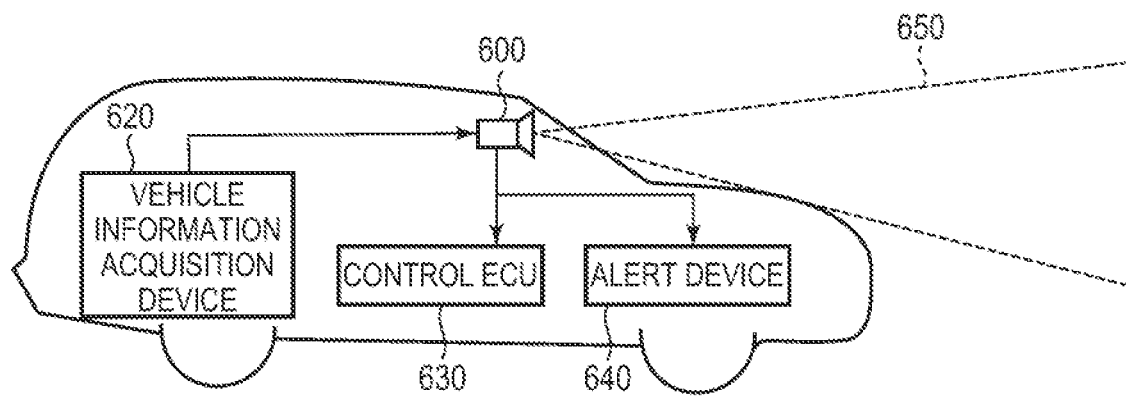

FIG. 14A and FIG. 14B are diagrams illustrating a configuration of an imaging system 600 and a moving body according to the present embodiment. FIG. 14A illustrates an example of an imaging system related to an in-vehicle camera. An imaging system 600 has an imaging device 1 according to any one of the above-described the first to seventh embodiments. The imaging system 600 has an image processing unit 612 that performs image processing on a plurality of image data acquired by the imaging device 1 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Herein, the parallax calculation unit 614 and the distance measurement unit 616 are an example of a distance information acquisition unit that acquires distance information on the distance to the object. That is, the distance information is information on a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 600 is connected to the vehicle information acquisition device 620 and can acquire vehicle information such as a vehicle speed, a yaw rate, a steering angle, or the like. Further, the imaging system 600 is connected to a control ECU 630, which is a control device that outputs a control signal for causing a vehicle to generate braking force based on a determination result by the collision determination unit 618. That is, the control ECU 630 is an example of the distance information acquisition unit. Further, the imaging system 600 is also connected to an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 14B illustrates the configuration of the imaging system 600 when a front area of a vehicle (a capturing area 650) is captured. The vehicle information acquisition device 620 sends an instruction to operate the imaging system 600 to perform imaging.

Thus, by configuring the imaging system 600 and the moving body to which the imaging device according to the first to seventh embodiments are applied, a high-performance imaging system 600 capable of acquiring high-quality images and a moving body capable of performing control with high accuracy can be realized.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving body (moving apparatus) such as a ship, an airplane, an industrial robot, for example. In addition, the imaging system can be widely applied to a device which utilizes object recognition such as an intelligent transportation system (ITS) or the like, without being limited to moving bodies.

Modified Embodiment

The present disclosure is not limited to the above-described embodiment, and various modifications can be applied. In the embodiment described above, one or two signal lines are arranged in one column of the pixel array 110, but the number of signal lines per column is not limited to this, and may be three or more. The number of signal lines per row may be, for example, four, eight, twelve, or the like.

In the embodiment described above, an example is shown in which the supply and disconnection of the driving current are controlled by switching the connection or disconnection between the current source and the signal line by the switch. In this example, when the driving current is changed from the disconnection state to the supply state by switching the switch, the assisting transistor is turned on to assist the change of the current of the signal line, thereby reducing the influence of the overshoot current. However, the present disclosure is not limited to the case where the driving current changes from the disconnection state to the supply state. For example, when the current amount of the driving current is changed from a small amount (state in which the driving current is first current amount) to a large amount (state in which the driving current is a second current amount greater than the first current amount), the assisting transistor may assist the change of the current, and a same effect can be obtained. In this case, the switch in the above-described embodiment may be replaced by a transistor capable of controlling the amount of current from the main electrodes to the first amount of current, the second amount of current, or the like, as a current adjusting unit. Alternatively, the current amount of the driving current can be controlled by changing the bias potential BIAS of the current source transistor 140 illustrated in FIG. 4 by the TG 750 serving as the current controlling unit. In this case, the current source transistor 140 serves as both a current source and a current adjusting unit. In the embodiment illustrated in FIG. 6, the current amount of the driving current can be controlled by changing the bias potential CBIAS of the cascode transistor 200 by the TG 750 which is a current controlling unit. In this case, the cascode transistor 200 is a current adjusting unit for adjusting the driving current. In the embodiment illustrated in FIG. 6, the current amount of the driving current may be changed by changing the bias potential CBIAS of the cascode transistor 200 and the bias potential BIAS of the current source transistor 140 by the TG 750 serving as the current controlling unit. In this case, the cascode transistor 200 and the current source transistor 140 are both current adjusting unit for adjusting the amount of the driving current. As described above, the switch in the embodiment described above is not limited to a switch that only controls the supply and disconnection of the driving current, but may be replaced with a switch that controls the amount of current to a plurality of values, so that the switch may be more generally called a current adjusting unit. The case where the current adjusting unit is a switch and the first current amount is the current amount in a state where the drive current is disconnected corresponds to the example of the above embodiment.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The above-described embodiments are merely examples of implementation in carrying out the present disclosure, and the technical scope of the present disclosure should not be construed in a limited manner. That is, the present disclosure can be implemented in various forms without departing from the technical idea or the main features thereof. For example, it should be understood that examples in which a part of the configuration of one embodiment is added to another embodiment, or examples in which a part of the configuration of another embodiment is replaced are also embodiments of the present disclosure.

According to the present disclosure, it is possible to provide a photoelectric conversion device in which signal quality deterioration caused by power source potential fluctuation is reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-102865, filed Jun. 15, 2020, which is hereby incorporated by reference herein in its entirety.

What is claimed is:

1. A photoelectric conversion device comprising:
   a pixel array in which a plurality of pixels, each of the plurality of pixels including a photoelectric conversion element, are arranged in a plurality of columns;
   a signal line that is arranged corresponding to one of the plurality of columns in the pixel array and to which a signal from the pixel is output;
   a current source configured to supply the signal line with a driving current;
   a current adjusting unit configured to control the driving current into a current amount including a first current amount and a second current amount greater than the first current amount; and
   an assisting element configured to assist a change in a current flowing through the signal line when the driving current changes from the first current amount to the second current amount,
   wherein the first current amount is a current amount in a state where the driving current is disconnected.

2. The photoelectric conversion device according to claim 1 further comprising a current controlling unit configured to control the current adjusting unit,
   wherein the current source is a driving transistor having a gate to which a bias potential is supplied, and
   wherein the current source operates as the current adjusting unit configured to change the driving current from the first current amount to the second current amount when the current controlling unit changes the bias potential.

3. The photoelectric conversion device according to claim 1, wherein the assisting element assists the change in the current flowing through the signal line by electrically connecting between a power source line having a power source potential and the signal line when the driving current changes from the first current amount to the second current amount.

4. The photoelectric conversion device according to claim 1, wherein the assisting element includes a transistor having a first main electrode that is connected to a power source line having a power source potential and a second main electrode that is connected to the signal line.

5. The photoelectric conversion device according to claim 4, wherein the transistor is a PMOS transistor.

6. The photoelectric conversion device according to claim 1, wherein the current source and the assisting element are arranged on the same side with respect to the pixel array in a direction in which the signal line extends.

7. The photoelectric conversion device according to claim 1 comprising a plurality of signal lines, each of the plurality of signal lines being arranged corresponding to one column in the pixel array,
   wherein a first signal line of the plurality of signal lines extends in a first direction with respect to the pixel array,
   wherein a second signal line of the plurality of signal lines extends in a second direction opposite to the first direction with respect to the pixel array, and
   wherein a circuit group including the current source, the current adjusting unit and the assisting element is arranged corresponding to each of the first signal line and the second signal line.

8. The photoelectric conversion device according to claim 7 further comprising:
   a first power source pad that is arranged in the first direction with respect to the pixel array and supplies the pixel with a power source potential; and a second power source pad that is arranged in the second direction with respect to the pixel array and supplies the pixel with a power source potential,
wherein the first power source pad and the second power source pad are electrically connected to each other by a power source line passing through the pixel array.

9. The photoelectric conversion device according to claim 1, wherein the current source includes a plurality of transistors that are cascode-connected.

10. The photoelectric conversion device according to claim 1 further comprising:
a first power source pad that supplies the pixel with a power source potential; and
a third power source pad that supplies the current source with a power source potential,
wherein the first power source pad and the third power source pad are electrically separated on a substrate on which the first power source pad and the third power source pad are arranged.

11. The photoelectric conversion device according to claim 1 further comprising a sample and hold circuit configured to hold a bias potential that controls the driving current,
wherein the sample and hold circuit samples the bias potential in a period in which the assisting elements assists the change in a current flowing through the signal line.

12. The photoelectric conversion device according to claim 1,
wherein the pixel array is arranged on a first substrate, and
wherein the assisting element is arranged on a second substrate which is different from the first substrate.

13. A photoelectric conversion system comprising:
the photoelectric conversion device according to claim 1; and
a signal processing unit configured to process a signal output from the photoelectric conversion device.

14. A moving body comprising:
the photoelectric conversion device according to claim 1;
a distance information acquisition unit configured to acquire distance information on a distance to an object, from a parallax image based on signals from the photoelectric conversion device; and
a control unit configured to control the moving body based on the distance information.

15. A photoelectric conversion device comprising:
a pixel array in which a plurality of pixels, each of the plurality of pixels including a photoelectric conversion element, are arranged in a plurality of columns;
a signal line that is arranged corresponding to one of the plurality of columns in the pixel array and to which a signal from the pixel is output;
a current source configured to supply the signal line with a driving current;
a current adjusting unit configured to control the driving current into a current amount including a first current amount and a second current amount greater than the first current amount; and
an assisting element configured to assist a change in a current flowing through the signal line when the driving current from the first current amount to the second current amount,
wherein the current adjusting unit is a switch configured to control connection or disconnection between the current source and the signal line.

16. The photoelectric conversion device according to claim 15 further comprising a current controlling unit configured to control the current adjusting unit,
wherein the current source is a driving transistor having a gate to which a bias potential is supplied, and
wherein the current source operates as the current adjusting unit configured to change the driving current from the first current amount to the second current amount when the current controlling unit changes the bias potential.

17. The photoelectric conversion device according to claim 15, wherein the assisting element assists the change in the current flowing through the signal line by electrically connecting between a power source line having a power source potential and the signal line when the driving current changes from the first current amount to the second current amount.

18. The photoelectric conversion device according to claim 15, wherein the assisting element includes a transistor having a first main electrode that is connected to a power source line having a power source potential and a second main electrode that is connected to the signal line.

19. The photoelectric conversion device according to claim 18, wherein the transistor is a PMOS transistor.

20. The photoelectric conversion device according to claim 15, wherein the current source and the assisting element are arranged on the same side with respect to the pixel array in a direction in which the signal line extends.

21. The photoelectric conversion device according to claim 15 comprising a plurality of signal lines, each of the plurality of signal lines being arranged corresponding to one column in the pixel array,
wherein a first signal line of the plurality of signal lines extends in a first direction with respect to the pixel array,
wherein a second signal line of the plurality of signal lines extends in a second direction opposite to the first direction with respect to the pixel array, and
wherein a circuit group including the current source, the current adjusting unit and the assisting element is arranged corresponding to each of the first signal line and the second signal line.

22. The photoelectric conversion device according to claim 21 further comprising:
a first power source pad that is arranged in the first direction with respect to the pixel array and supplies the pixel with a power source potential; and
a second power source pad that is arranged in the second direction with respect to the pixel array and supplies the pixel with a power source potential,
wherein the first power source pad and the second power source pad are electrically connected to each other by a power source line passing through the pixel array.

23. The photoelectric conversion device according to claim 15 further comprising:
a first power source pad that supplies the pixel with a power source potential; and
a third power source pad that supplies the current source with a power source potential,
wherein the first power source pad and the third power source pad are electrically separated on a substrate on which the first power source pad and the third power source pad are arranged.

24. The photoelectric conversion device according to claim 15,
wherein the pixel array is arranged on a first substrate, and
wherein the assisting element is arranged on a second substrate which is different from the first substrate.

25. A photoelectric conversion system comprising:
the photoelectric conversion device according to claim 15; and
a signal processing unit configured to process a signal output from the photoelectric conversion device.

26. A moving body comprising:
the photoelectric conversion device according to claim 15;
a distance information acquisition unit configured to acquire distance information on a distance to an object, from a parallax image based on signals from the photoelectric conversion device; and
a control unit configured to control the moving body based on the distance information.

* * * * *